(12) United States Patent
Lee et al.

(10) Patent No.: US 6,258,676 B1
(45) Date of Patent: Jul. 10, 2001

(54) METHOD FOR FORMING A SHALLOW TRENCH ISOLATION USING HDP SILICON OXYNITRIDE

(75) Inventors: Kong Hean Lee; Peter Chew, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/431,241

(22) Filed: Nov. 1, 1999

(51) Int. Cl.[7] .......................... H01L 21/336; H01L 21/76
(52) U.S. Cl. .......................... 438/296; 438/404; 438/424
(58) Field of Search .................................. 438/296, 404, 438/424

(56) References Cited

U.S. PATENT DOCUMENTS

| | | | |
|---|---|---|---|
| 5,258,332 | 11/1993 | Horioka et al. | 437/228 |
| 5,721,173 | 2/1998 | Yano et al. | 438/424 |
| 5,753,562 | 5/1998 | Kim | 438/424 |
| 5,851,899 | 12/1998 | Weigand | 438/427 |
| 6,107,143 | * 8/2000 | Park et al. | |
| 6,121,064 | * 9/2000 | Lasky et al. | |
| 6,153,480 | * 11/2000 | Arghavani et al. | |

* cited by examiner

Primary Examiner—John F. Niebling
Assistant Examiner—Josetta I. Jones
(74) Attorney, Agent, or Firm—George O. Saile; Rosemary L. S. Pike; William J. Stoffel

(57) ABSTRACT

A Method for forming a shallow trench isolation using HDP silicon oxynitride. A pad oxide layer is formed on a semiconductor substrate having an active area and an isolation area and a barc layer is formed over the pad oxide layer. The barc layer, the pad oxide layer, and the semiconductor substrate are patterned to form a trench having rounded corners in the isolation area. A liner oxide layer is formed over the semiconductor substrate, and a gap fill layer is formed on the liner oxide layer. An important feature of the invention is that the gap fill layer is composed of silicon oxynitride formed using a high density plasma chemical vapor deposition process. A portion of the gap fill layer over the active area can be removed using a reverse trench mask etch, and the gap fill layer is further planarized with a chemical mechanical polishing process using the liner oxide layer as chemical mechanical polishing stop.

14 Claims, 3 Drawing Sheets

METHOD FOR FORMING A SHALLOW TRENCH ISOLATION USING HDP SILICON OXYNITRIDE

BACKGROUND OF INVENTION

1) Field of the Invention

This invention relates generally to fabrication of a semiconductor device and more particularly to a method for forming a shallow trench isolation using HDP silicon oxynitride.

2) Description of the Prior Art

As the density of components on integrated circuits increases, effective isolation between circuits and/or devices becomes increasingly important. Typically, isolation of circuit components in modern integrated circuit technology takes the form of shallow trenches which are etched into the semiconductor substrate and filled with an insulating material, usually silicon dioxide. These trenches filled with insulating material are generally referred to in the art as a shallow trench isolation (STI) or shallow trench isolation region.

Because of the complex topography of modem integrated circuits, a problem is often encountered in achieving a uniform fill of insulating material in the trenches. This is especially true when trenches of varying widths are used. In order to address this problem, a number of methods have been developed for filling STI trenches with insulating materials and for planarizing the resulting structures in order to obtain a uniform planer topography. STI filling methods include chemical vapor deposition (CVD) and plasma enhanced chemical vapor deposition, which take advantage of the fact that insulating material can be transported as a vapor to a surface and deposited thereon. Additionally, sputtering techniques or thermal techniques which grow oxide layers directly in the trenches (e.g. LOCOS) are also useful for filling STI trenches. Planarization schemes such as resist etch-back, reactive ion etching, and chemical mechanical polishing processes are employed, individually or in combination, to planarize the surface of the semiconductor substrate following formation of an insulating layer.

Although all of the above-mentioned STI fill methods have been used successfully for filling both narrow and wide trenches in semiconductor substrates, voids can occur in the insulating material of the STI due to imperfect filling conditions. Hence, there exists a need for a gapless filling technique for STI trenches in modern semiconductor fabrication. In addition to the need for gapless trench filling process, there exists a problem of planarizing the resulting structure. A highly planarized surface topography is desirable since it allows for the deposition of additional integrated circuit components and permits greater device density.

Weigand (U.S. Pat. No. 5,851,899) discloses a method for voidless gapfill and planarization, using high density plasma-chemical vapor deposition (HDP-CVD) to fill the trenches, and using a reverse mask etch followed by a short CMP process to planarize the resulting silicon dioxide STI structure.

However, the silicon dioxide STI structures formed by the method disclosed by Weigand suffer from two problems as the result of subsequent processing steps common to modern semiconductor fabrication. Exposed portions of the silicon dioxide STI structure can be etched by a HF etching process which is commonly used for etching through adjacent silicon oxide layers to form contacts (such as for source and drain regions), and to form suicides, for devices (such as transistors) in modern semiconductor fabrication. The etching of the silicon dioxide STI structure can cause recesses in the STI structure which can cause leakage. Also, thermal stress, due to high temperature processing, such as source and drain ion drive-in, can cause leakage problems in silicon dioxide STI structures.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,851,899 (Wiegand) shows a method of forming a shallow trench isolation by filling a trench with HDP silicon dioxide, performing a reverse mask etch to reduce the thickness of the HDP silicon dioxide over active areas, and performing a short chemical mechanical polishing process.

U.S. Pat. No. 5,753,562 (Kim) shows a method of forming a shallow trench isolation by forming oxide spacers on the sidewalls of a trench, forming a nitride layer, forming a second oxide layer, and planarizing.

U.S. Pat. No. 5,721,173 (Yano et al.) shows a HDP silicon dioxide gap fill layer and planarization process using a polysilicon etch barrier.

U.S. Pat. No. 5,258,332 (Horioka et al.) discloses a method for forming a trench with rounded corners using fluorine and oxygen chemical dry etching process.

SUMMARY OF THE INVENTION

It is an object of the present invention to provide a method for forming a shallow trench isolation which is resistant to recessed thickness caused by subsequent processing, particularly HF etching.

It is another object of the present invention to provide a method for forming a shallow trench isolation which is resistant to thermal stress induced leakage.

It is another object of the present invention to provide a method for forming a shallow trench isolation which is resistant to HF etching and thermal stress by forming a liner oxide layer followed by a HDP silicon oxynitride ($SiO_xN_y$) layer in a trench having rounded corners, wherein the liner oxide layer is used as a stop layer for a HDP silicon oxynitride chemical mechanical polishing process.

It is yet another object of the present invention to provide a method for forming a shallow trench isolation without first forming a pad oxide/silicon nitride stack over the active areas of the substrate.

To accomplish the above objectives, the present invention provides a method for forming a shallow trench isolation using HDP silicon oxynitride. A pad oxide layer is formed on a semiconductor substrate having an active area and an isolation area and a barc layer is formed over the pad oxide layer. The barc layer, the pad oxide layer, and the semiconductor substrate are patterned to form a trench having rounded corners in the isolation area. A liner oxide layer is formed over the semiconductor substrate, and a gap fill layer is formed on the liner oxide layer. An important feature of the invention is that the gap fill layer is composed of silicon oxynitride formed using a high density plasma chemical vapor deposition process. A portion of the gap fill layer over the active area is removed, and the gap fill layer is planarized with a chemical mechanical polishing process using the liner oxide layer as chemical mechanical polishing stop.

The main steps of a method for forming a shallow trench isolation using HDP silicon nitride according to the present invention are summarized in table 1.

TABLE 1

| FIGS. | PROCESS STEP |
| --- | --- |
| 1–2 | form a tranch having rounded corners |
| 3 | grow a liner oxide layer |
| 4 | deposit a HDP silicon oxynitride |
| 5 | reverse mask etch HDP silicon oxynitride over active areas |
| 6 | CMP using liner oxide layer as a CMP stop |
| 7 | remove liner oxide layer |

The present invention provides considerable improvement over the prior art. The HDP silicon oxynitride gap fill layer provides good gap filling properties like HDP oxide, but the HDP silicon oxynitride is also resistant to damage by HF etching and high temperature processing. The use of the liner oxide layer as a CMP stop provides effective planarization of the gap fill layer. Also, since the CMP is stopped above the level of the semiconductor substrate, the residual silicon oxynitride overlying the active areas can be removed using an $H_3PO_4$ dip without recessing the STI structure.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a shallow trench isolation using HDP silicon oxynitride.

Figure 1:
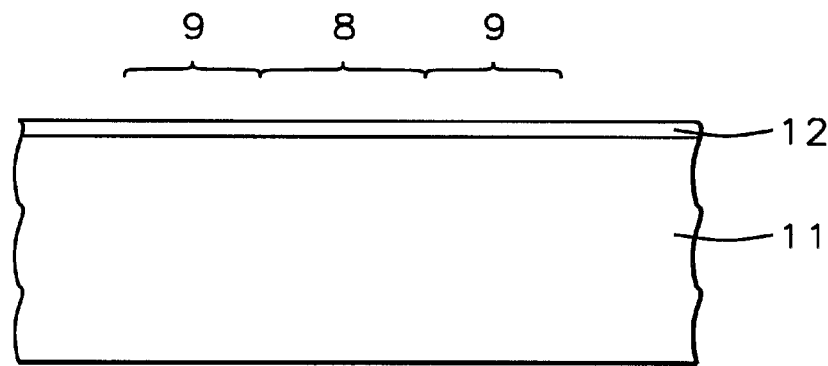
FIGS. 1 through 7 illustrate sequential sectional views of a process for forming a shallow trench isolation using HDP silicon oxynitride according to the invention.

Referring to FIG. 1, the preferred embodiment of the present invention begins by providing a semiconductor substrate (11) having one or more active areas (8) and one or more isolation areas (9). Semiconductor substrate (11) is understood to possibly include a substrate composed of a semiconducting material such as silicon or a silicon on insulator structure (SOI). Most importantly, for the present invention, semiconductor substrate (11) should be understood to have a silicon surface. Typically devices such as transistor gates and the like are formed on the active areas (8), and isolation structures such as a shallow trench isolation are formed in the isolation areas (9), separating and defining the active areas (8).

Still referring to FIG. 1, a pad oxide layer (12) is formed on the semiconductor substrate (11). The pad oxide layer (12) is preferably composed of silicon dioxide thermally grown to a thickness of between about 50 Angstroms and 200 Angstroms.

Figure 2:
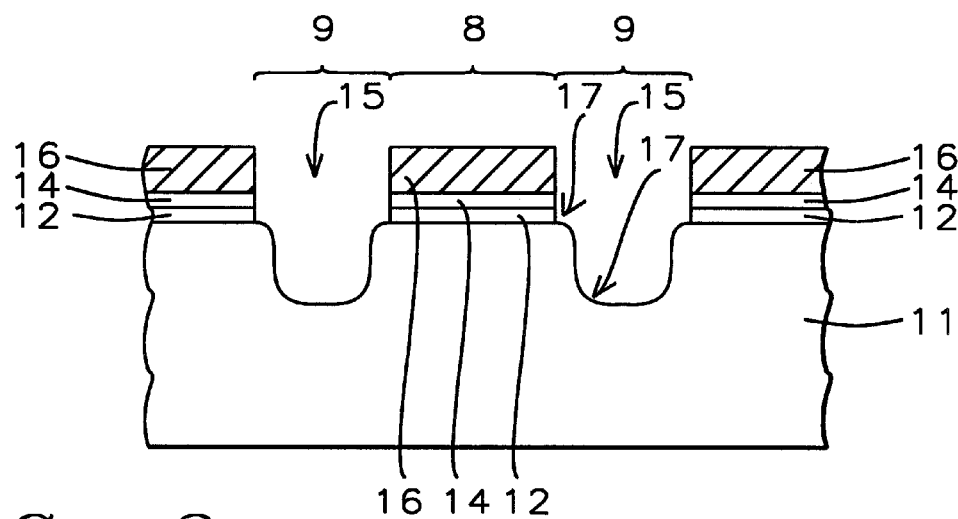

Referring to FIG. 2, a barc layer (14) is formed over the pad oxide layer (12) to prevent pattern distortion by reflected light. The barc layer (14), the pad oxide layer (12), and the semiconductor substrate are patterned to form a trenches (15), having a bottom and sidewalls, in the isolation areas (9) of the semiconductor substrate (11). A purpose of the barc layer (14) is to prevent light reflection from the substrate during photolithography. The barc layer (14) can be composed of sulfer, hydrogen, and oxygen and preferably has a thickness of between about 300 Angstroms and 1200 Angstroms.

Still referring to FIG. 2, the barc layer (14), the pad oxide layer (12), and the semiconductor substrate are preferably patterned by forming a photoresist mask (16) having an opening overlying the area of the intended trench, and ething the barc layer (14), the pad oxide layer (12), and the semiconductor substrate (11) through the opening. The photoresist mask (16) and the barc layer (14) after etching. The trench is preferably etched to a depth of between about 2500 Angstroms and 5000 Angstroms below the top surface of the semiconductor substrate. Typically, a semiconductor substrate will have both narrow trenches having a width of between about 0.1 microns and 0.4 microns and wide trenches having a width of between about 1 micron and 20 microns.

The preferred etch process for forming trenches with rounded corners (17) is shown in table 2. This in-situ etch chemistry change enables the amount of polymer by-product build-up to be controlled. The polymer by-product build-up will gradually change the slope of the trench in the semiconductor substrate, causing rounded corners.

TABLE 2

| layer etched | etch chemicstry |
| --- | --- |
| BARC layer (14) | $CHF_3 + O_2$ |
| pad oxide layer (12) | $CHF_3$, $CF_4$ |
| semiconductor substrate (11) | $CF_4$, $Cl_2$, HBr |

The photoresist mask (16) can be removed using an ashing process as is known in the art. The barc layer (14) is preferably removed using an SCI ($H_2O_2+NH_4OH+H_2O$) and an SPM ($H_2O_2+H_2SO_4+H_2O$) process.

Figure 3:
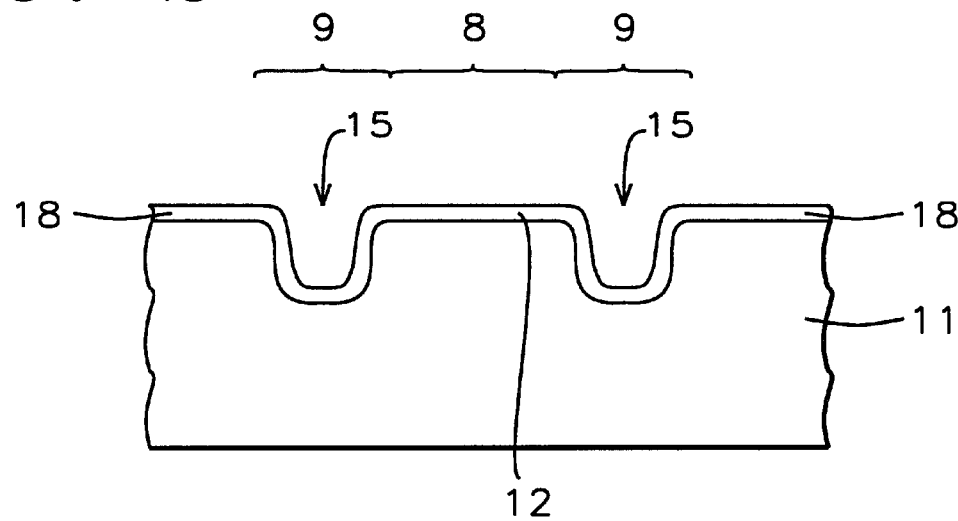

Referring to FIG. 3, a liner oxide layer (18) is formed over the semiconductor substrate (11), thereby lining the bottom and sidewalls of the trench (15). The liner oxide layer (18) is preferably formed to a thickness of between about 100 Angstroms and 300 Angstroms using a thermal oxidation process. Optionally, the pad oxide layer (not shown) can be removed using an oxide etch selective to silicon prior to forming the liner oxide layer (18).

Figure 4:
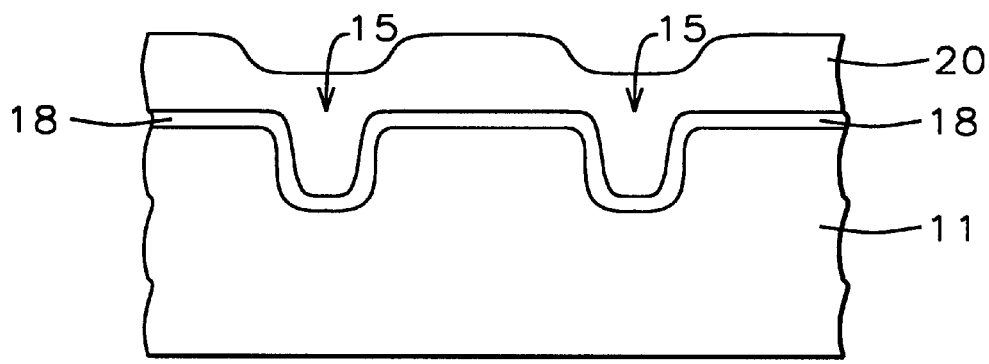

Referring to FIG. 4, a gap fill layer (20) is formed on the liner oxide layer (18). The gap fill layer (20) is composed of silicon oxynitride formed using a high density plasma chemical vapor deposition process. An example of a preferred high density plasma silicon oxynitride (HDP-SiON) deposition process is described in attorney docket CS 99-144 (K. H. Lee et al.) to be filed, and assigned to the same assignee as the present invention. The gap fill layer (20) has a sufficient thickness to completely fill the trench (15), preferably between about 3000 Angstroms and 9000 Angstroms. The gap fill layer (20) can be formed by reacting $SiH_4$, NO, and $NO_2$ gasses.

Next, the gap fill layer (20) is planarized. A preferred planarization process is described below. As shown in FIG. 4, the topography of the gap fill layer (20) will be such that the surface will be higher over the active area (8) than it will be over the isolation area (9) where it must first fill the trench (15). The greater the variation in topography between the active area (8) and the isolation area (9), the longer the duration of the chemical mechanical polishing process that is required to planarize the gap fill layer (20). In the preferred embodiment of the present invention, the gap fill layer (20) preferably has a thickness of between about 500 Angdstroms and 2500 Angstroms above the surface of the semiconductor substrate (11) in the active area (8).

Figure 5:
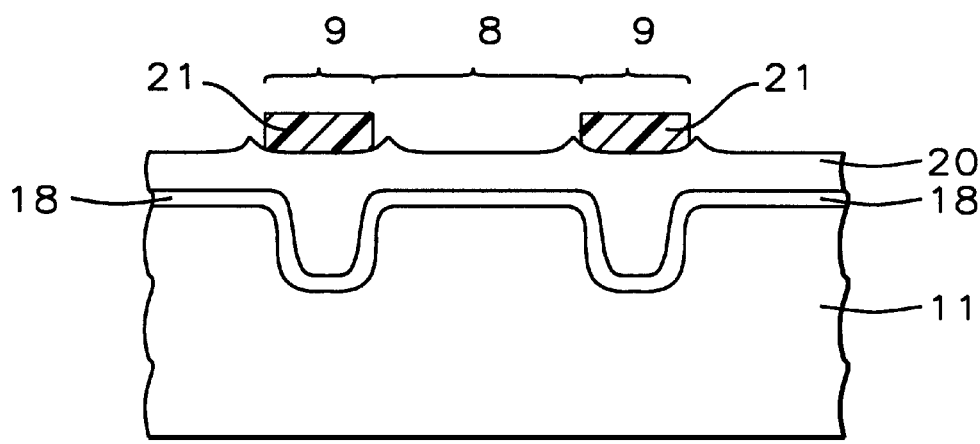

Referring to FIG. 5, a portion of the gap fill layer (20) over the active area (8) is removed. The gap fill layer (20) can be selectively removed above the active area (8) using a reverse trench mask (21) and etch process as is known in the art. The reverse trench mask can be formed by using an "inverse" optical mask or by using opposite type (e.g. positive or negative) photoresist exposed through the same optical mask. A reverse trench mask (e.g. photoresist mask) is formed, having the reverse pattern of the mask used for the trench etch. Openings are formed over the areas where the trench mask was solid (e.g. active areas) and the reverse trench mask is solid over areas where the trench mask had openings (e.g. isolation areas). The gap fill layer (20) is etched through the openings in the reverse trench mask, thereby partially removing the gap fill layer overlying the active areas (8).

Figure 6:
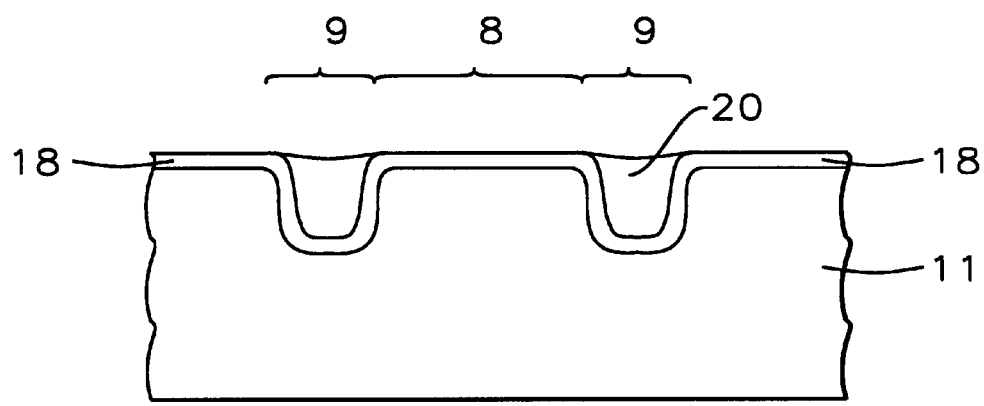

Referring to FIG. 6, the reverse trench mask (21) is removed, and the gap fill layer (20) is planarized with a chemical mechanical polishing process using the liner oxide layer (18) as a chemical mechanical polishing stop. A silicon oxynitride chemical mechanical polishing process is performed having a short duration, preferably less than 250 seconds. Because of the reverse trench etch mask, the variations in topography are small and the duration the silicon oxynitride chemical mechanical polishing process is short, reducing the degree of dishing which occurs in the STI structures, particularly wide STI structures. Another key advantage of the present invention is that the liner oxide layer (18) can be used as a CMP stop layer, allowing the gap fill layer (18) to be completely removed over the active areas (8) while the gap fill layer (20) in the isolation areas (9) is higher than the top surface of the adjacent semiconductor substrate (11).

Figure 7:
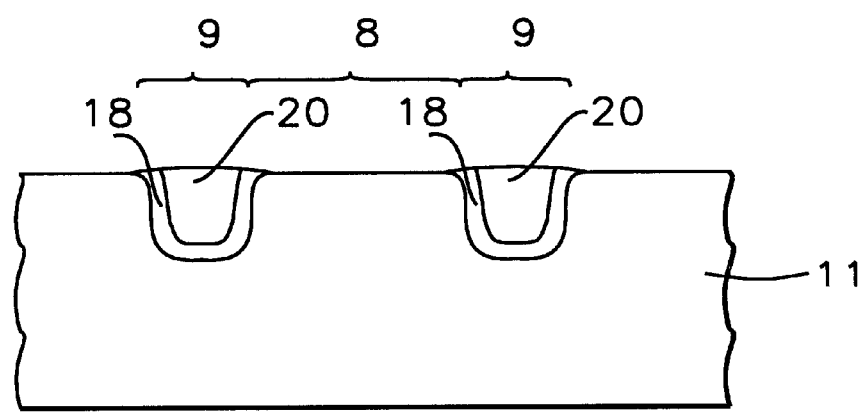

Referring to FIG. 7, the gap fill layer (20) is etched using a short $H_3PO_4$ dip to remove any residue over the active areas (8). Because the chemical mechanical polishing process stopped on the liner oxide layer (18), the gap fill layer (20) in the isolation area (9) is not etched below the level of the top surface of the adjacent semiconductor substrate (11). The liner oxide layer (18) is then removed using an oxide dip.

Semiconductor processing can continue using methods and processes known in the art. A gate oxide layer and devices can be formed on the exposed semiconductor substrate surface in the active areas.

While the invention has been particularly shown and described with reference to the preferred embodiments thereof, it will be understood by those skilled in the art that various changes in form and details may be made without departing from the spirit and scope of the invention.

What is claimed is:

1. A Method for forming a shallow trench isolation using HDP silicon oxynitride, comprising the steps of:
   a. providing a semiconductor substrate having an active area and an isolation area;
   b. forming a trench in said isolation area of said substrate; said trench having a bottom and sidewalls;
   c. forming a liner oxide layer over said semiconductor substrate;
   d. forming a gap fill layer on said liner oxide layer; said gap fill layer being composed of silicon oxynitride formed using a high density plasma chemical vapor deposition process; and
   e. planarizing said gap fill layer.

2. The method of claim 1 which further includes forming a pad oxide layer prior to forming said trench; and removing said pad oxide layer prior to forming said liner oxide layer.

3. The method of claim 1 wherein said liner oxide layer is composed of thermally grown silicon dioxide having a thickness of between about 50 Angstroms and 300 Angstroms.

4. The method of claim 1 wherein said gap fill layer is composed of high density plasma-chemical vapor deposition silicon oxynitride having a thickness of between about 3000 Angstroms and 9000 Angstroms over said active areas.

5. The method of claim 3 wherein said gap fill layer is composed of high density plasma-chemical vapor deposition silicon nitride having a thickness of between about 3000 Angstroms and 9000 Angstroms over said active areas.

6. The method of claim 1 wherein said gap fill layer is formed by reacting $SiH_4$ with NO and $NO_2$ in a high density plasma reactor.

7. The method of claim 1 wherein said gap fill layer is planarized using a reverse trench mask etch followed by a silicon oxynitride chemical mechanical polishing process having a duration of less than 250 seconds.

8. The method of claim 1 which further includes removing any residual silicon oxynitride overlying said active area using a $H_3PO_4$ dip and removing said liner oxide layer overlying said active area using an oxide dip.

9. A method for forming a shallow trench isolation using HDP silicon oxynitride, comprising the steps of:

a. forming a pad oxide layer on a semiconductor substrate; said semiconductor substrate having an active area and an isolation area;
b. forming a barc layer over said pad oxide layer;
c. patterning said barc layer, said pad oxide layer, and said semiconductor substrate to form a trench in said isolation area of said semiconductor substrate; said trench having a bottom and sidewalls and further having rounded corners;
d. removing said pad oxide layer;
e. thermally growing a liner oxide layer over said semiconductor substrate;
f. forming a gap fill layer on said liner oxide layer; said gap fill layer being composed of silicon oxynitride formed using a high density plasma chemical vapor deposition process;
g. removing a portion of said gap fill layer over said active area;
h. planarizing said gap fill layer with a chemical mechanical polishing process using said liner oxide layer as chemical mechanical polishing stop;
i. removing silicon oxynitride residue overlying said active areas using a $H_3PO_4$ dip; and
j. removing said liner oxide layer overlying said active areas.

10. The method of claim 9 wherein said liner oxide layer is composed of thermally grown silicon dioxide having a thickness of between about 50 Angstroms and 300 Angstroms.

11. The method of claim 9 wherein said gap fill layer is composed of high density plasma-chemical vapor deposition silicon oxynitride having a thickness of between about 3000 Angstroms and 9000 Angstroms over said active areas.

12. The method of claim 10 wherein said gap fill layer is composed of high density plasma-chemical vapor deposition silicon oxynitride having a thickness of between about 3000 Angstroms and 9000 Angstroms over said active areas.

13. The method of claim 9 wherein said gap fill layer is formed by reacting $SiH_4$ with NO and $NO_2$ in a high density plasma reactor.

14. The method of claim 9 wherein said gap fill layer is planarized using a reverse trench mask etch followed by a silicon oxynitride chemical mechanical polishing process having a duration of less than 250 seconds.

* * * * *